United States Patent
de Gruijl

(10) Patent No.: US 8,400,188 B2
(45) Date of Patent: Mar. 19, 2013

(54) METHODS, SYSTEMS AND ARRANGEMENTS FOR EDGE DETECTION

(75) Inventor: Robert de Gruijl, San Francisco, CA (US)

(73) Assignee: NXP B.V., Eindhoven (NL)

( * ) Notice: Subject to any disclaimer, the term of this patent is extended or adjusted under 35 U.S.C. 154(b) by 267 days.

(21) Appl. No.: 12/922,456

(22) PCT Filed: Mar. 16, 2009

(86) PCT No.: PCT/IB2009/051078
§ 371 (c)(1), (2), (4) Date: Sep. 14, 2010

(87) PCT Pub. No.: WO2009/115978
PCT Pub. Date: Sep. 24, 2009

(65) Prior Publication Data
US 2011/0018585 A1  Jan. 27, 2011

Related U.S. Application Data

(60) Provisional application No. 61/036,962, filed on Mar. 16, 2008.

(51) Int. Cl.
*H03K 5/22* (2006.01)
*H03L 7/00* (2006.01)

(52) U.S. Cl. .......................................... 327/24; 327/144

(58) Field of Classification Search ............... 327/24, 327/141, 142, 144, 145
See application file for complete search history.

(56) References Cited

U.S. PATENT DOCUMENTS

| | | | |
|---|---|---|---|
| 4,380,736 A | 4/1983 | Pfaff | |
| 4,692,635 A | 9/1987 | Rapp | |
| 4,973,860 A * | 11/1990 | Ludwig | 327/145 |
| 5,012,127 A | 4/1991 | Gates et al. | |
| 5,117,314 A | 5/1992 | Bathaee et al. | |
| 5,418,825 A | 5/1995 | Cantrell et al. | |
| 5,732,090 A | 3/1998 | Mio | |
| 5,929,676 A * | 7/1999 | Graf, III | 327/144 |
| 6,163,584 A | 12/2000 | Weng et al. | |
| 6,900,674 B2 * | 5/2005 | Sutera et al. | 327/144 |
| 2006/0222132 A1 | 10/2006 | Beaudoin et al. | |

OTHER PUBLICATIONS

International Search Report and Written Opinion for Int'l. patent appln. No. PCT/IB2009/051078 (Jul. 17, 2009).

* cited by examiner

*Primary Examiner* — Hai L Nguyen

(57) ABSTRACT

A variety of edge-detection related devices, methods and systems are implemented in various fashions. One implementation is directed to an edge detector circuit for detecting an edge of an input signal and producing an output level-sensitive signal that is synchronous to a clock signal having an active edge corresponding to a transition from a first-signal level to a second-signal level. A first flip-flop has the input signal as a clock input and produces an internal level-sensitive signal and is reset by the output level-sensitive signal. Logic passes the level-sensitive signal when the clock signal is at the second-signal level and blocks the internal level-sensitive signal when the clock signal is at the first-signal level. A second flip-flop is set by the passed internal level-sensitive signal to produce the output level-sensitive signal. The second flip-flop is cleared in response to the output level-sensitive signal, a reset input and the clock signal.

15 Claims, 5 Drawing Sheets

METHODS, SYSTEMS AND ARRANGEMENTS FOR EDGE DETECTION

The present invention relates generally to edge detection, and more specifically, to mitigating stability problems in edge detection circuits.

Many electrical circuits, systems and arrangements use signals to communicate between components operating in different clock domains. These communications are generally subject to corrupted data due to problems occurring when signals cross the different clock domains. A common issue is meta-stability of a receiving circuit. Meta-stability represents a state of a circuit where the output of the circuit is unknown, often involving oscillation between different output values. In a specific example, meta-stability problems emerge when setup or hold times are violated for a receiving circuit, such as a flip-flop. Setup and hold times are periods, relative to the local clock, during which the input of the receiving circuit should not change. Due to a lack of synchronicity between different clock domains, these setup and hold times cannot be guaranteed in many systems and circuits.

A specific type of input circuit is an edge detector. Generally speaking, an edge detector produces a level-sensitive signal from a received edge-sensitive signal. Meta-stability problems can emerge in an edge detector when, for example, the level-sensitive signal is to be used in a clock domain that is asynchronous to the received edge-sensitive signal. Methods exist for mitigating meta-stability problems. One such method involves the use of double synchronizers. An example double synchronizer is two (or more) flip-flops connected in a series, each clocked by the same clock. Generally speaking, the likelihood that a flip-flop in the series enters a meta-stable condition is less than the likelihood that the preceding flip-flop enters a meta-stable condition. In this manner, the likelihood that the final output enters a meta-stable condition can be reduced by adding additional flip-flops in the series. While somewhat effective, this type of solution can be considered less than ideal. For example, an increase in the stability using a double (or more) synchronizer comes at a cost of both additional logic and additional delays. More specifically, each new flip-flop in the series represents both an additional logic block and a delay equal to the clock period.

A variety of edge-detection related devices, methods and systems are implemented in various fashions. One embodiment of the present invention is directed to an implementation of an edge detector circuit for detecting an edge of an input signal and producing an output level-sensitive signal that is synchronous to a clock signal having an active edge corresponding to a transition from a first-signal level to a second-signal level. A first flip-flop has the input signal as a clock input, produces an internal level-sensitive signal and is reset by the output level-sensitive signal. Logic passes the level-sensitive signal when the clock signal is at the second-signal level and blocks the internal level-sensitive signal when the clock signal is at the first-signal level. A second flip-flop is set by the passed internal level-sensitive signal to produce the output level-sensitive signal. The second flip-flop is cleared in response to the output level-sensitive signal, a reset input and the clock signal.

Another embodiment is directed to an implementation that includes a method for detecting an edge of an input signal and producing an output level-sensitive signal that is synchronous to a clock signal having an active edge corresponding to a transition from a first-signal level to a second-signal level. An internal level-sensitive signal is produced in response to the edge of the input signal. The internal level-sensitive signal is blocked when the clock signal is at the first-signal level. The level-sensitive signal is passed when the clock signal is at the second-signal level. The passed internal level-sensitive signal is latched to produce the output level-sensitive signal. The internal level-sensitive signal is reset in response to the output level-sensitive signal. The latched output level-sensitive signal is latched in response to the output level-sensitive signal, a reset input and the clock signal.

Another embodiment of the present invention includes an implementation of a system for providing edge detection. A first edge detector circuit detects a first edge of an input signal that represents a first transition. The first edge detector circuit produces an output level-sensitive signal that is synchronous to a clock signal having an active edge corresponding to a transition from a first-signal level to a second-signal level. A first flip-flop has the input signal as a clock input to produce an internal level-sensitive signal and is reset by the output level-sensitive signal. Logic passes the level-sensitive signal when the clock signal is at the second-signal level and blocks the internal level-sensitive signal when the clock signal is at the first-signal level. A second flip-flop is set by the passed internal level-sensitive signal to produce the output level-sensitive signal. The output level-sensitive signal is cleared in response to the output level-sensitive signal, a reset signal and the clock signal.

The above summary is not intended to describe each embodiment or every implementation of the present disclosure. The figures and detailed description that follow more particularly exemplify various embodiments.

The invention may be more completely understood in consideration of the following detailed description of various embodiments of the invention in connection with the accompanying drawings, in which.

Figure 1:
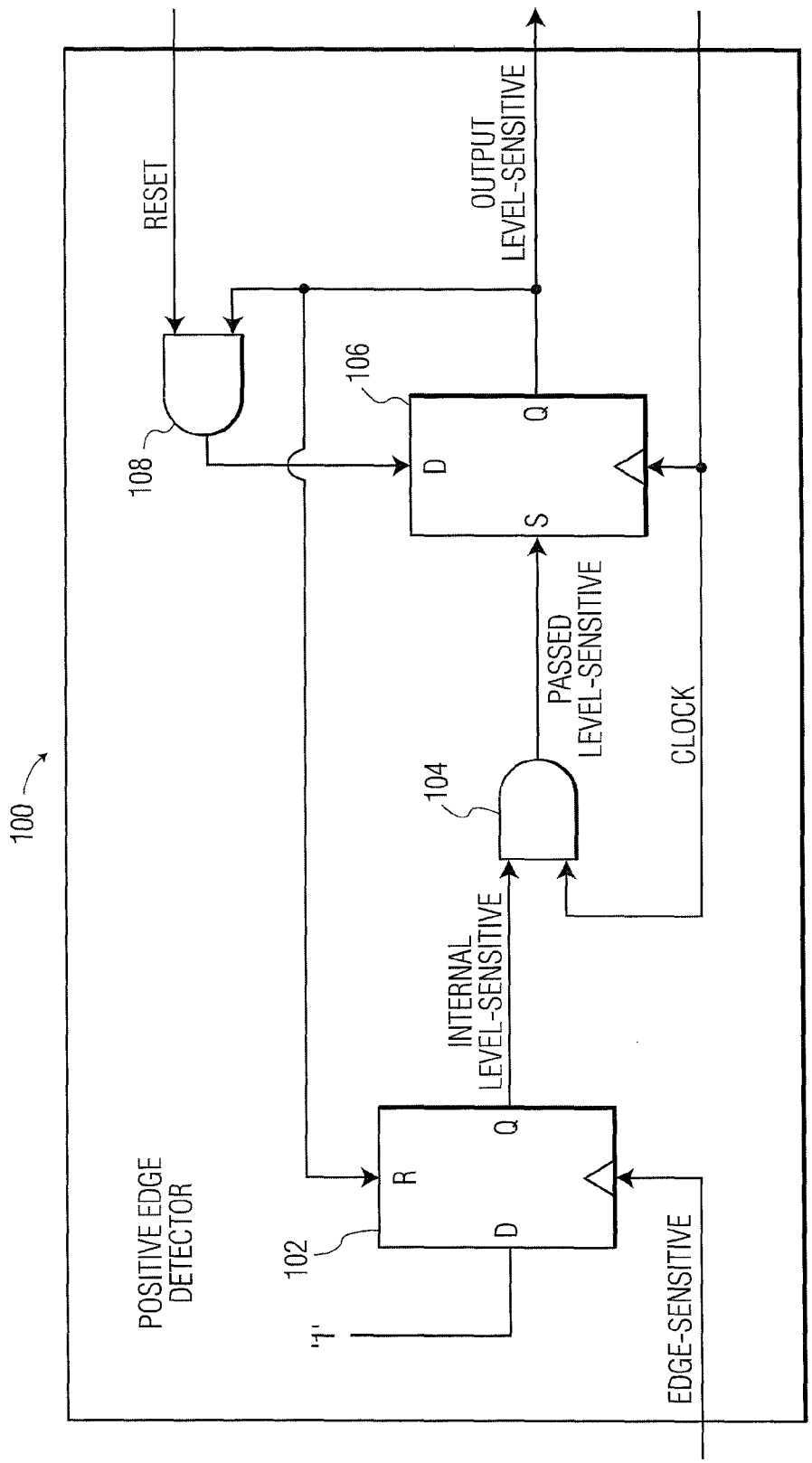
FIG. 1 shows a diagram for an edge detection circuit, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

The present invention is believed to be applicable to a variety of different types of processes, devices and arrangements for use with edge detection circuits, and in particular, to approaches for edge-detection between different clock domains. While the present invention is not necessarily so limited, various aspects of the invention may be appreciated through a discussion of examples using this context.

Consistent with an example embodiment of the present invention, a circuit is implemented that provides a level-sensitive output that is responsive to an edge-sensitive input. The circuit converts the edge-sensitive signal into an internal level-sensitive signal. The internal level-sensitive signal is inhibited during periods where violations of setup or hold times are present or are likely to occur. The signal is allowed to pass during periods of time where the violations of setup or hold times are not present, or at least are less likely to occur.

Consistent with a more specific embodiment of the present invention, the circuit resets the edge detection circuit upon allowing passage of the internal level-sensitive signal. The passed internal level-sensitive signal is used as an output to another circuit. A reset signal, potentially from the other circuit, can reset the output. In one instance, the reset of the output can be done in a manner that is synchronous to the receiving clock domain.

Consistent with another example embodiment of the present invention, an edge detection device is used to detect both positive and negative going edges. In one instance, the edge detection device includes two edge detection circuits. Each edge detection circuit is connected to an edge-sensitive signal. One of the edge detection circuits detects a negative going edge and the other edge detection circuit detects a positive-going edge.

FIG. 1 shows a diagram for an edge detection circuit, according to an example embodiment of the present invention. Positive edge detector 100 includes inputs for an edge-sensitive signal, a reset signal and a clock. Edge detector 100 also provides a level-sensitive signal as an output. The edge-sensitive signal is changed into a level sensitive signal using flip-flop 102. This is accomplished by connecting the clock input to the edge-sensitive signal. For simplicity it is assumed that flip-flop 102 is responsive to positive-going edges; however, the invention is not so limited and can be implemented using a flip-flop that is responsive to negative-going edges. Accordingly, when a positive-going edge occurs on the edge-sensitive signal the input of the flip-flop (D) is latched to the output of the flip-flop (Q). Assuming active high signaling (again for simplicity), a static '1' is latched/clocked from the input to the output. This 'internal level-sensitive signal' is then conditionally passed through element 104. Element 104 also receives the clock as an input. In a specific embodiment, element 104 is a logical AND gate. In the configuration shown by FIG. 1, the internal level sensitive signal is only passed to the output when the clock signal is high (i.e., the output of the gate is zero unless both inputs are high). This conditional passing prevents the output of the edge detector from transitioning when the clock signal is low. Accordingly, output transitions occur between (approximately) one to one-half of a clock period prior to the active edge of the clock.

The passed level-sensitive signal is next latched by setting flip-flop 106. The state of this output level-sensitive signal is maintained until a reset is provided. In particular, element 108 provides a feedback loop to maintain the state of flip-flop 106 until a reset signal is applied. When a reset signal is applied, the reset signal overrides the feedback thereby resetting the flip-flop on the following clock edge.

The output signal is also used to reset flip-flop 102, which can then detect another transition of the edge-sensitive signal. Assuming that the setup and hold times are less than about half the period of the clock (often a reasonable assumption) the output of flip-flop 106 should not violate setup and hold times of the clock domain. It may still be possible for a signal to violate setup and hold times. For example, if the clock signal, as received at the edge detector, is sufficiently skewed relative to the clock signal, as received with the output level-sensitive signal, it may be possible for the output level-sensitive signal to arrive sufficiently close to (or even slightly before) a positive edge so as to violate hold times. This would be particularly troublesome in systems with long clock delays due to routing or other factors. In one instance, these types of problems can be identified by performing statistical timing analysis of the design. In a specific instance, extra delays can be added into the clock or output signal (e.g., using additional buffers) to compensate for such issues.

Figure 2:
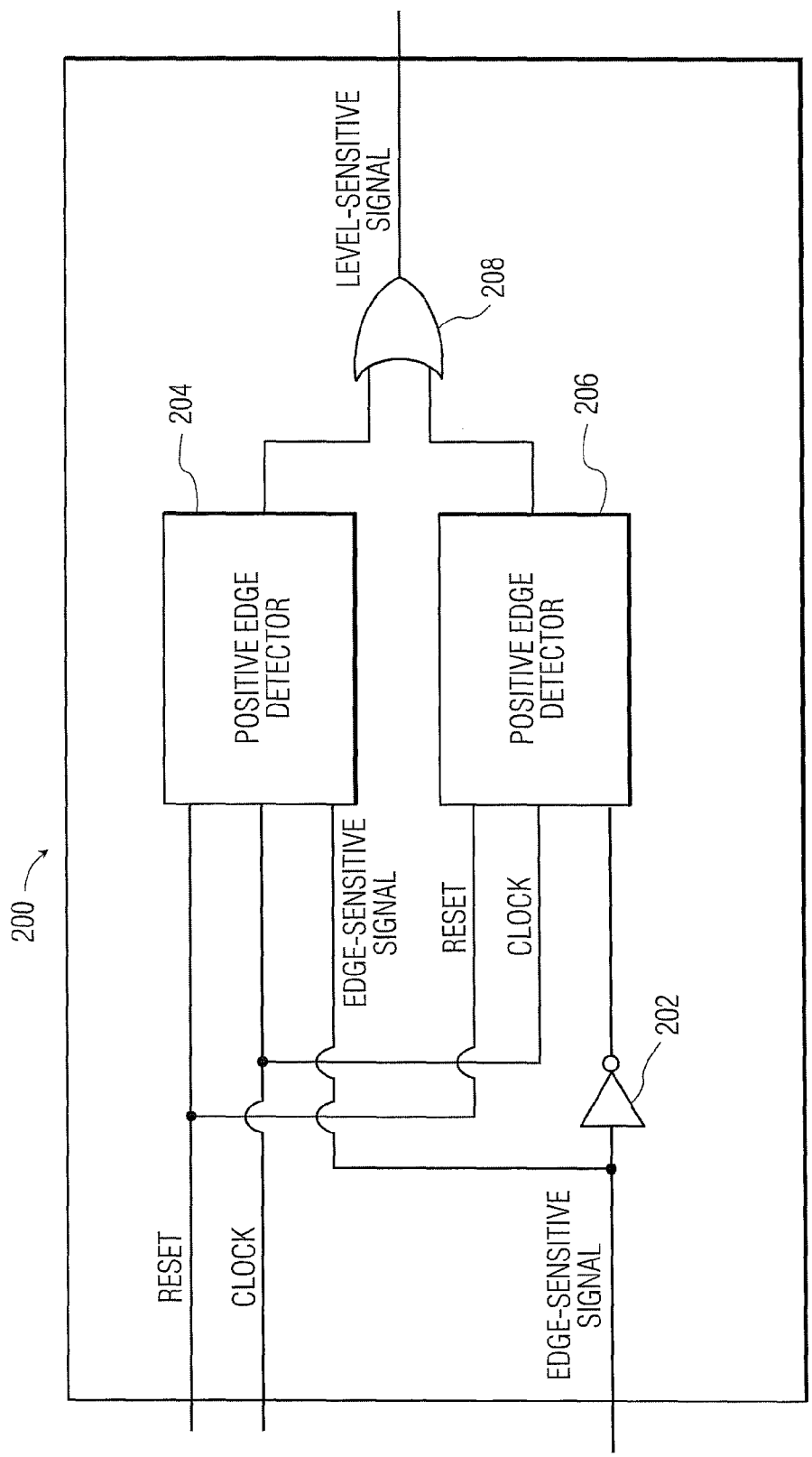
FIG. 2 shows a device for providing positive and negative edge detection, according to an embodiment of the present invention.

FIG. 2 shows a device for providing positive and negative edge detection, according to an embodiment of the present invention. Device 200 generates an output level-sensitive signal in response to either a negative-going or positive-going edge on the edge-sensitive signal. In particular, the outputs of edge detectors 204 and 206 are logically combined to produce the output signal using, for example, an OR gate. In a particular embodiment, each of edge detectors 204 and 206 can be implemented using functionality shown in FIG. 1.

Edge detector 204 and 206 are shown as both being positive edge detectors; however, edge detector 206 receives an inverted version of the edge-sensitive signal. Thus, edge detector 206 functions as a negative-going edge detector.

Various other combinations of edge detectors can also be implemented. For instance, two or more edge detectors can be used to synchronize an edge-sensitive signal to different clock domains for each edge detector. This can be accomplished by providing a different input clock to each edge detector. In another instance, a plurality of edge detectors can be used in combination with a plurality of different edge-sensitive signals. The outputs can be individually used or combined from two or more of the edge detectors. In certain instances, a plurality of resets can also be used to reset subsets of the plurality of edge detectors.

A specific example of an environment that can make use of one or more of such combinations is an environment that uses a handshake protocol between two components of a system. The first component uses the edge-sensitive signal to notify the second component. The second component receives the synchronized, level-sensitive signal. Sometime after the notification is received by the second component, the level-sensitive signal can be reset to allow for subsequent edge-sensitive signals to be detected. This type of hand-shake protocol is sometimes used for interrupt handling by a processor. For example, an interrupt generator uses an edge-sensitive signal to indicate that an interrupt has been generated. The processor receives a level-sensitive signal that indicates that the interrupt was generated. As an acknowledgment of receipt of the interrupt or after handling the interrupt, the processor resets the interrupt. Once reset a new interrupt can be received and/or handled by the processor.

Figure 3:
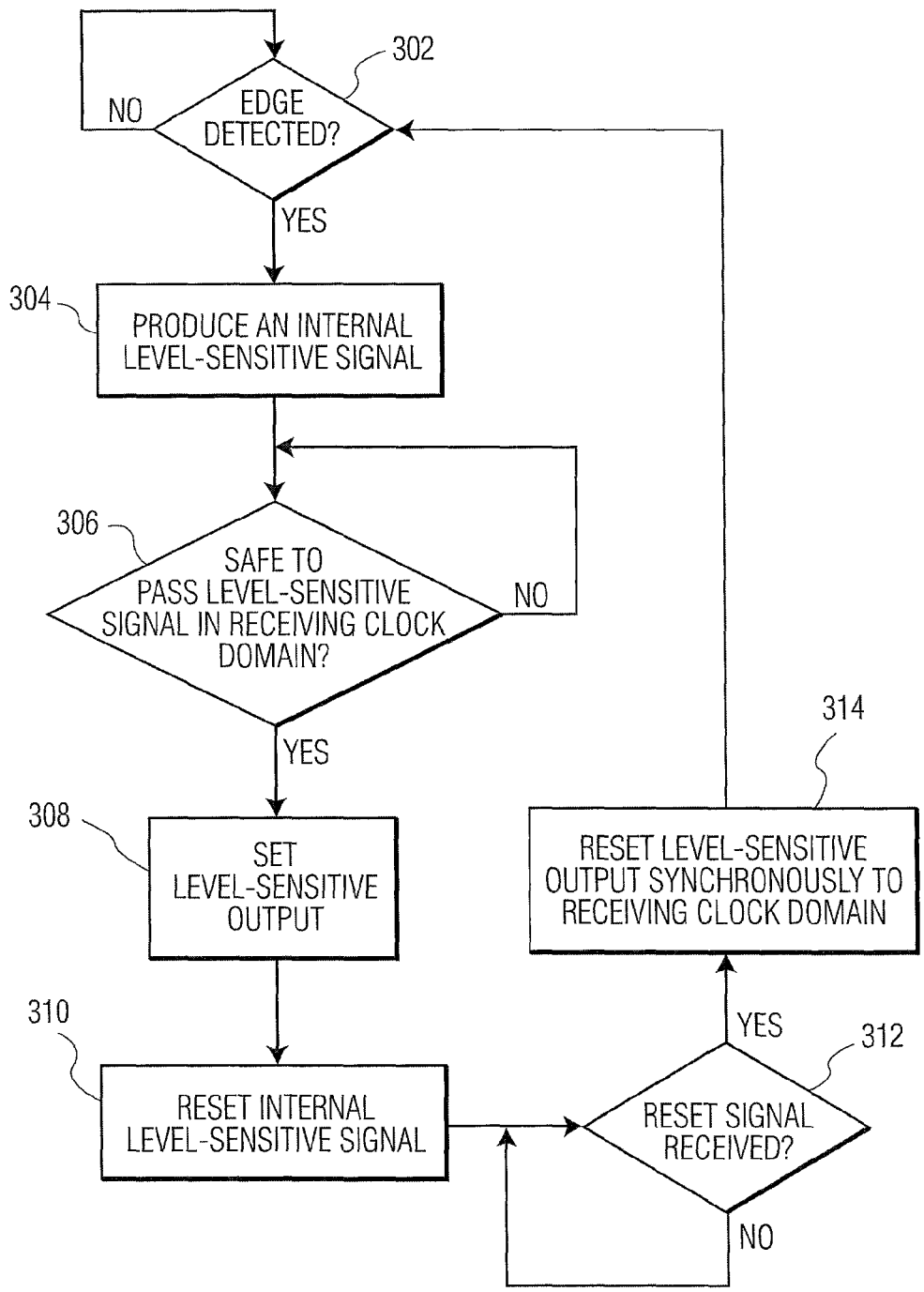
FIG. 3 shows a flow diagram of a process consistent with an example embodiment of the present invention.

FIG. 3 shows a flow diagram of a process consistent with an example embodiment of the present invention. The process stays at step 302 until a determination/detection of an edge event occurs. Once an edge event occurs, the process proceeds to step 304. At step 304 the edge-sensitive signal is converted to an internal level-sensitive signal. Steps 302 and 304 can be implemented, for example, by connecting the edge-sensitive signal to the clock input of a flip-flop.

The process stays at step 306 until it is determined that it is safe to pass the internal level-sensitive signal. This determination can be made, for example, by monitoring the state of the receiving clock domain. More specifically, the signal can be inhibited (not passed) until the clock is at a signal level from which the active edge cannot directly occur. This means that for clock domain in which the positive-going edge is the active edge, the clock is at a high signal level (i.e., the clock cannot transition from negative to positive while currently positive). The converse is true for a clock domain in which the negative-going edge is the active edge (i.e., the clock cannot transition from positive to negative while currently negative).

Once it is determined that it is safe to pass the internal level-sensitive signal, the process proceeds to step 308. In step 308, the output of the edge detector is set/latched.

At step 310 the internal level-sensitive signal is reset. In a particular implementation, the output signal is used as an internal reset signal.

Step 312 shows that the process maintains this state (output active) until a (external) reset signal is received. If a reset signal is received, the process proceeds to step 314, where the level-sensitive output is reset. In a particular embodiment, the reset event is done synchronously.

The process then returns to step 302 wherefrom it can be repeated as necessary.

Figure 4:
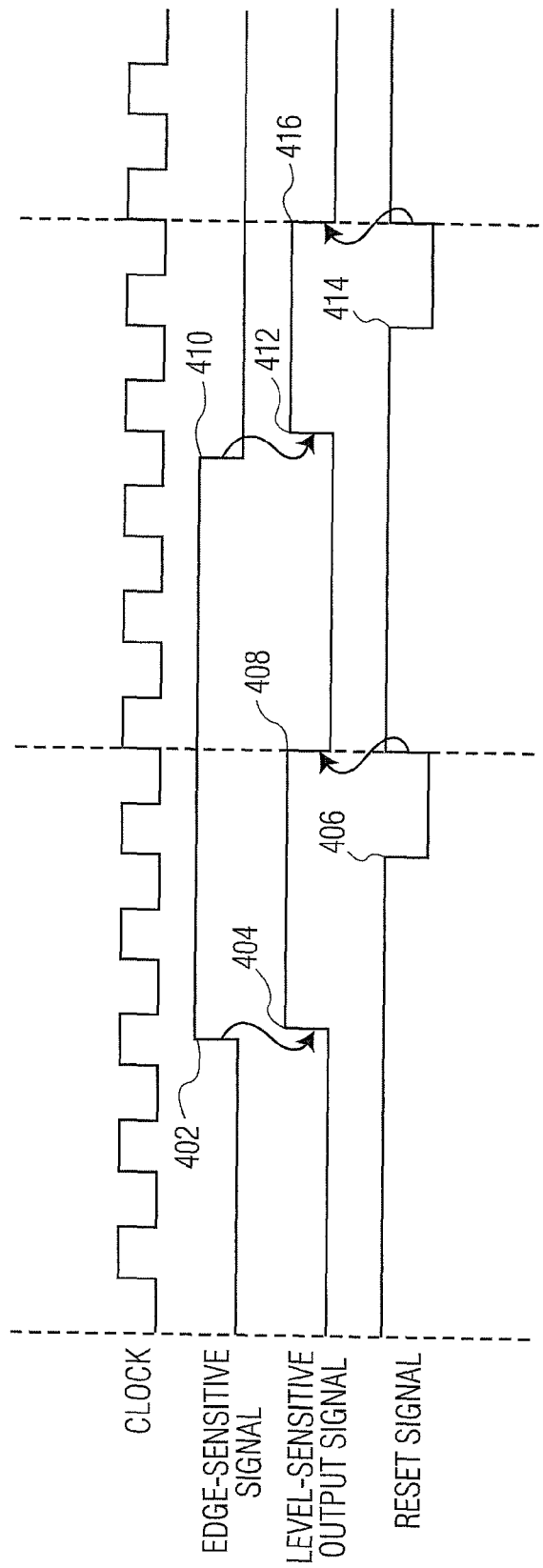
FIG. 4 shows a timing diagram consistent with an example embodiment of the present invention.

FIG. 4 shows a timing diagram consistent with an example embodiment of the present invention. In particular, four different signals are shown including a clock, an edge-sensitive signal, a level-sensitive signal and a reset signal. Consistent with various embodiments discussed herein, a positive-going edge event occurs at point 402. This event is detected and converted into a level-sensitive output signal at point 404. As shown in FIG. 4, the clock signal is at a high signal level at point 402 and level-sensitive output signal is not in danger of violating setup times (e.g., due to being just before a positive-going edge of the clock signal). Assuming that the active edge of the clock domain is a positive-going edge and that the duty cycle of the clock is around 50%, the signal should be stable, prior to an active clock edge, for a time that is between about one full period and one-half period of the clock. The level-sensitive output signal is passed relatively quickly as shown by time 404. The slight delay from point 402 to 404 represents internal circuit delays and not a prohibition on passing the level-sensitive signal.

At time 406 the (active low) reset signal becomes active. The level-sensitive output signal does not immediately transition. Instead, the transition occurs at time 408 in a manner synchronous with the clock.

At time 410 a negative-going edge event occurs. In this instance, the event occurs while the clock signal is at a low signal level. Assuming again that the active edge of the clock domain is a positive-going edge, the level-sensitive output signal is not passed until the clock signal reaches a high signal level at point 412. In this instance, the level-sensitive output signal is available approximately a full clock period ahead of the next positive-going edge of the clock. This is particularly useful for instances where point 410 occurs very close to the active edge of the clock, potentially violating setup times. At time 414 a reset pulse is received resulting in the level-sensitive output being reset at time 416.

The waveforms shown in FIG. 4 assume that the system is designed for detecting both positive and negative going edges and also that the active-edges of the clock are positive going edges. The invention, however, is not so limited. Variations include, but are not limited to, only detecting one of either a positive-edge or a negative-edge, a clock with a negative active edge or an active-high reset signal.

Figure 5:
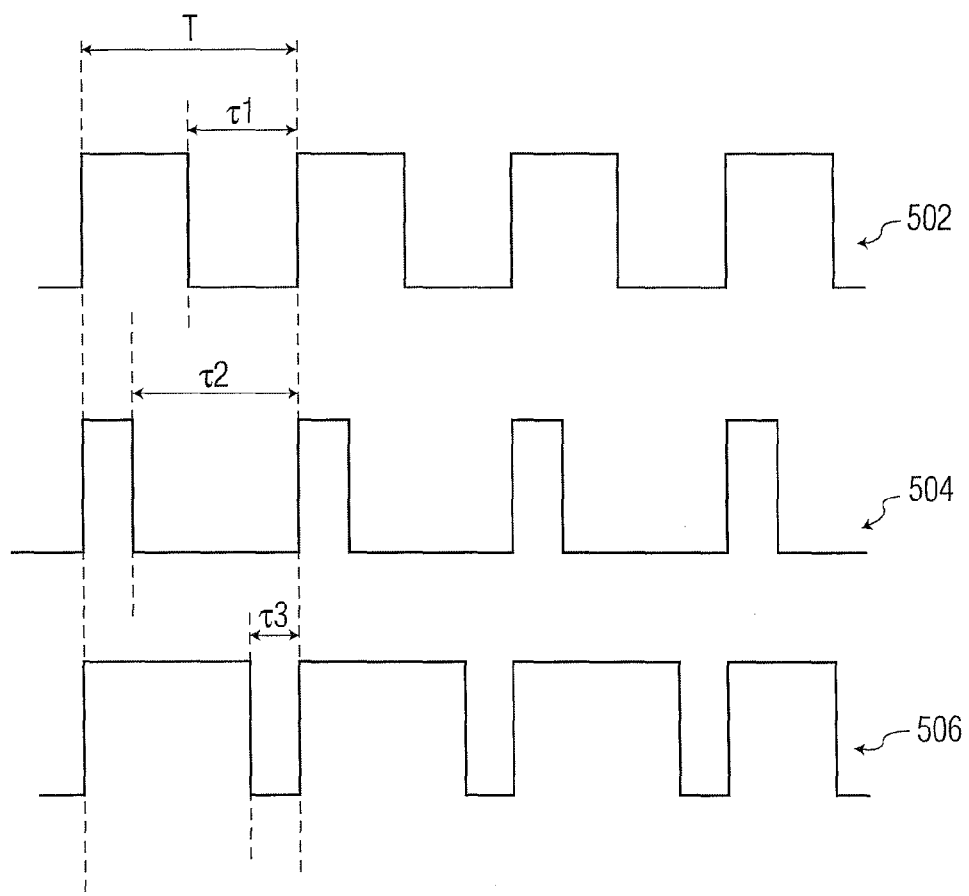
FIG. 5 shows a timing diagram for various clock signals for use with an example embodiment of the present invention.

FIG. 5 shows a timing diagram for various clock signals for use with an example embodiment of the present invention. Variations of the present invention use a clock that does not have a 50% duty cycle. Clocks 502, 504 and 506 each have the same period T but different duty cycles. The different duty cycles result in correspondingly different minimum times $\tau$, where $\tau$ represents the time that the inputs signal is stable before an active edge of the clock. For example, the minimum stable time of clock 502, represented with a 50% duty cycle, is $\tau 1$. This minimum stable time can be adjusted, relative to the same clock period, by adjusting the duty cycle accordingly. For example, $\tau 2$ represents an increased minimum stable time while $\tau 3$ represents a decrease in the minimum stable time.

In a particular instance, an increased setup time can be useful for further reducing the likelihood of meta-stable conditions. In another instance, a reduced stable time is acceptable and can be useful for reducing the chance that the input signal is delayed for an extra clock cycle. In this manner, a designer of the system can adjust the clock duty cycle as desired. In a specific instance, the clock can be reproduced with the desired frequency using a local phase-locked loop (PLL). This can be useful for adjusting the duty cycle of the clock locally without affecting other circuits.

While the present invention has been described above and in the claims that follow, those skilled in the art will recognize that many changes may be made thereto without departing from the spirit and scope of the present invention.

What is claimed is:

1. An edge detector circuit for detecting an edge of an input signal and producing an output level-sensitive signal that is synchronous to a clock signal having an active edge corresponding to a transition from a first-signal level to a second-signal level, the circuit comprising:
    a first flip-flop that is configured and arranged with the input signal as a clock input to produce an internal level-sensitive signal and to be reset by the output level-sensitive signal;
    logic configured and arranged to pass the internal level-sensitive signal in response to the clock signal being at the second-signal level and to block the internal level-sensitive signal in response to the clock signal being at the first-signal level; and
    a second flip-flop that is configured and arranged to set by the passed internal level-sensitive signal and to produce the output level-sensitive signal and that is cleared in response to the output level-sensitive signal, a reset input and the clock signal.

2. The circuit of claim 1, wherein a set input of the second flip-flop has the internal level-sensitive signal as an input.

3. The circuit of claim 1, wherein a set input of the second flip-flop is tied to the internal level-sensitive signal and the output level-sensitive signal and the reset input are logically combined to produce a combined signal that is an input to a D input of the flip-flop.

4. The circuit of claim 3, wherein the second flip-flop is clocked by the clock signal.

5. The circuit of claim 1, wherein the logic includes a logical AND of the internal level-sensitive signal and the clock signal.

6. The circuit of claim 1, wherein the first flip-flop has a static input that has a signal level that corresponds to the produced internal level-sensitive signal.

7. A method for detecting an edge of an input signal and producing an output level-sensitive signal that is synchronous to a clock signal having an active edge corresponding to a transition from a first-signal level to a second-signal level, the method comprising:
    producing an internal level-sensitive signal in response to the edge of the input signal;
    blocking the internal level-sensitive signal when the clock signal is at the first-signal level;
    passing the internal level-sensitive signal when the clock signal is at the second-signal level;
    latching the passed internal level-sensitive signal to produce the output level-sensitive signal;
    resetting the internal level-sensitive signal in response to the output level-sensitive signal; and
    clearing the latched output level-sensitive signal in response to the output level-sensitive signal, a reset input and the clock signal.

8. The method of claim 7, wherein the step of producing an internal level-sensitive signal includes using the input signal as a clock for latching a static value that represents an active signal level of the internal level-sensitive signal.

9. The method of claim 7, wherein the step of latching the passed internal level-sensitive signal includes using a feedback loop to maintain a signal level of the output level-sensitive signal.

10. The method of claim 7, wherein the step of latching the passed internal level-sensitive signal includes using a feedback loop to maintain a signal level of the output level-sensitive signal and wherein the step of clearing the latched output level-sensitive signal includes overriding the feedback loop.

11. The method of claim 7, wherein the steps of blocking the internal level-sensitive signal and passing the level-sensitive signal are implemented using a logical AND of the clock signal and the internal level-sensitive signal.

12. A system for providing edge detection, the system comprising:

a first edge detector circuit that is configured and arranged to detect a first edge of an input signal representing a first transition and produce an output level-sensitive signal that is synchronous to a clock signal having an active edge corresponding to a second transition from a first-signal level to a second-signal level, the first edge detector circuit having a first flip-flop that is configured and arranged with the input signal as a clock input to produce an internal level-sensitive signal and to be reset by the output level-sensitive signal;

a logic configured and arranged to pass the internal level-sensitive signal in response to the clock signal being at the second-signal level and to block the internal level-sensitive signal in response to the clock signal being at the first-signal level; and a second flip-flop that is configured and arranged to set by the passed internal level-sensitive signal and to produce the output level-sensitive signal and that is cleared in response to the output level-sensitive signal, a reset signal and the clock signal.

13. The system of claim 12, further including a second edge detector circuit configured to detect another edge of the input signal that represents a third transition between two signal levels that are opposite of the first transition.

14. The system of claim 12, further including a processor configured and arranged to receive the output level-sensitive signal and for providing the reset signal as an acknowledgement of receipt of the output level-sensitive signal.

15. The system of claim 12, wherein a static input of the second flip-flop is tied to the internal level-sensitive signal and the system further includes circuitry configured and arranged to logically combine the output level-sensitive signal and the reset input to produce a combined signal that is an input to a D input of the flip-flop.

* * * * *